(12) United States Patent
Hsu

(10) Patent No.: US 6,194,104 B1
(45) Date of Patent: Feb. 27, 2001

(54) OPTICAL PROXIMITY CORRECTION (OPC) METHOD FOR IMPROVING LITHOGRAPHY PROCESS WINDOW

(75) Inventor: Tzu-Jeng Hsu, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/414,923

(22) Filed: Oct. 12, 1999

(51) Int. Cl.$^7$ ................................. G03F 9/00; G06F 3/00
(52) U.S. Cl. ............................................ 430/5; 395/500.21
(58) Field of Search ................... 430/5, 296; 395/500.2, 395/500.21, 500.22, 500.23; 356/400, 401

(56) References Cited

U.S. PATENT DOCUMENTS

| | | | |
|---|---|---|---|
| 5,182,718 | 1/1993 | Harafuji et al. | 364/490 |
| 5,432,714 | 7/1995 | Chung et al. | 364/525 |
| 5,553,273 | 9/1996 | Liebmann | 395/500 |
| 5,682,323 | 10/1997 | Pasch et al. | 364/491 |
| 5,723,233 | 3/1998 | Garza et al. | 430/5 |
| 5,827,623 | 10/1998 | Ishida et al. | 430/5 |
| 6,064,485 | * 5/2000 | Lin et al. | 356/400 |

OTHER PUBLICATIONS

O.W. Otto et al., "Automated Optical Proximity Correction—A Rules–Based Approach", Optical/Laser Micrlithography VII, Proc. SPIE (2197), 1994, pp. 278–293.

J. Stirniman et al., "Optimizing Proximity Correction for Wafer Fabrication Processes", 14th Annual BACUS Symposium on Photomask Technology & Management, Proc. SPIE (2322) 1994, pp. 239–246.

S. Shioiri et al., "Fast Optical Proximity Correction: Analytical Method", Optical/Laser Microlithography VIII, Proc. SPIE (2440) 1995, pp. 261–269.

* cited by examiner

Primary Examiner—S. Rosasco
(74) Attorney, Agent, or Firm—George O. Saile; Stephen B. Ackerman; Larry J. Prescott

(57) ABSTRACT

A method is described for applying Optical Proximity Correction to corners and line ends in a pattern having critical dimensions in the sub micron region. Segments of curves are used to approximate corners and line ends in a pattern. The normal vector to the curve and area vector are then determined for all points on the segment of the curve used to approximate the pattern feature. The area vector has the same direction as the normal vector and a magnitude equal to the distance between the curve and the undistorted pattern. An optical proximity correction vector is then determined as the sum of a first scaler function multiplied by the unit normal vector and a second scaler function multiplied by the area vector. Next an optimum optical proximity correction shape is determined by moving the curve a distance and direction equal to the optical proximity correction vector. The optimum proximity correction shape is then approximated using regular geometric shapes, rectangles and triangles, to form an optical proximity corrected pattern. A mask of the optical proximity corrected pattern can be formed using electron beam methods without requiring excessive electron beam time.

17 Claims, 5 Drawing Sheets

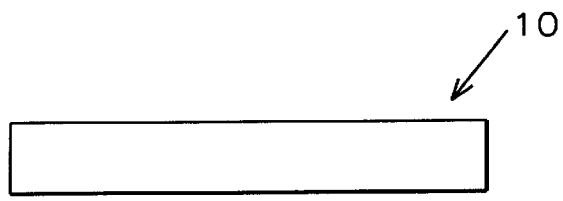
*FIG. 1A - Prior Art*
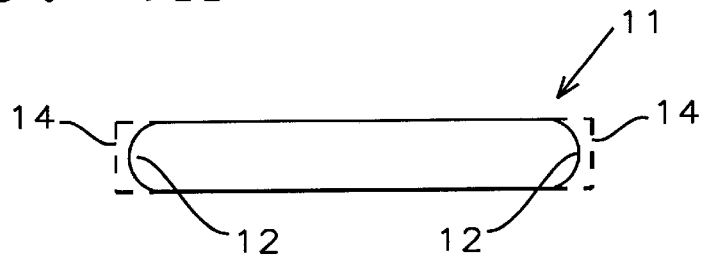
*FIG. 1B - Prior Art*
*FIG. 2A - Prior Art*
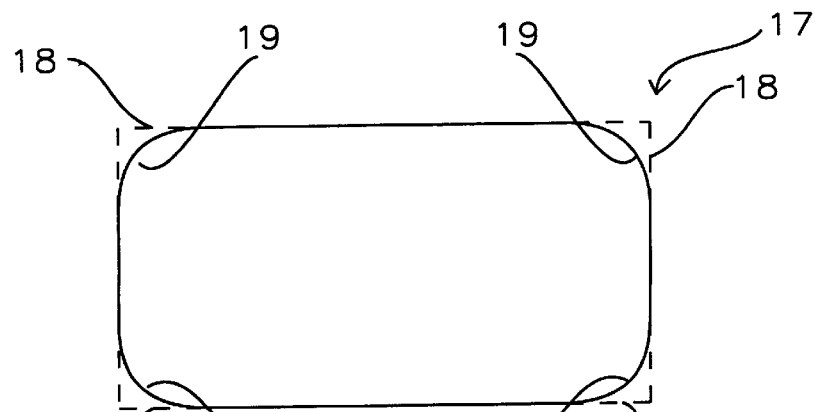
*FIG. 2B - Prior Art*

OPTICAL PROXIMITY CORRECTION (OPC) METHOD FOR IMPROVING LITHOGRAPHY PROCESS WINDOW

BACKGROUND OF THE INVENTION

(1) Field of the Invention

This invention relates to a method of Optical Proximity Correction for photolithographic patterns and more specifically to the use of mathematical modeling based on curve fitting to achieve Optical Proximity Correction.

(2) Description of the Related Art

Photolithography is critical to the fabrication of integrated circuit wafers and utilizes masks to transfer images, such as line/space patterns, to the wafer. As circuit densities increase critical dimensions decrease and line/space patterns become more and more dense. FIGS. 1A and 1B show an example of line distortion that can occur for small critical dimensions, such as in the sub-micron range. FIG. 1A shows an intended pattern element 10 which is to be transferred to a layer of resist material on an integrated circuit wafer. FIG. 1B shows the optical effects of the small dimensions in the patterns 11 actually transferred to the layer of resist. As shown in FIG. 1B the corners of the pattern are rounded resulting in rounded ends 12 of the pattern element and a shortened line. The dashed lines 14 indicate the intended limits of the pattern element.

FIGS. 2A and 2B show an example of corner rounding that can occur in pattern segments of larger rectangular regions. FIG. 2A shows an intended pattern of a larger rectangular pattern segment 16 which is to be transferred to a layer of resist material on an integrated circuit wafer. FIG. 2B shows the optical proximity effects on the corners of the larger rectangular pattern segment 17 actually transferred to the layer of resist. As shown in FIG. 2B the corners of the pattern segment are distorted resulting in rounded corners 19. The dashed lines 18 indicate the intended limits of the pattern segment.

This optical distortion shown in FIGS. 1A–2B is the result of Optical Proximity Effect. Optical Proximity Effect is a form of optical distortion associated with the formation of photolithographic images. Diffraction effects occurring on both sides of a sharp pattern edge become important as the critical dimensions of pattern features decreases. Optical Proximity Correction is employed to compensate for the Optical Proximity Effect.

U.S. Pat. No. 5,553,273 to Liebman describes a method which first identifies a plurality of design shapes in computer aided design data for a lithography mask. The design shapes are sorted according to geometric type. The design shapes are them sorted and a bias is applied to the sorted design shapes.

U.S. Pat. No. 5,182,718 to Harafuji et al. describes a method of correcting design patterns in cells having hierarchial structure and corresponding to exposure patterns.

U.S. Pat. No. 5,432,714 to Chung et al. describes a system and method for preparing shape data for proximity correction.

U.S. Pat. No. 5,827,623 to Ishida et al. describes a method of forming an improved halftone type phase shift mask having an Optical Proximity Correction function.

U.S. Pat. No. 5,682,323 to Pasch et al. describes a system and method of performing optical proximity correction on an integrated circuit by performing optical proximity correction on a library of cells.

U.S. Pat. No. 5,723,233 to Garza et al. describes a photolithography Optical Proximity Correction method for mask layouts.

A paper by O. W. Otto et al. "Automated optical proximity correction—a rules-based approach," Optical/Laser Microlithography VII, Proc. SPIE (2197) 1994, pages 278–293 describes a rules based approach for optical proximity correction.

A paper by J. Stirniman and M. Rieger "Optimizing proximity correction for wafer fabrication process," 14th Annual BACUS Symposium on Photomask Technology and Management, Proc. SPIE (2322) 1994, pages 239–246 describes a methodology for characterizing proximity effects from measurements taken on a processed wafer.

A paper by S. Shioiri and H. Tanabe "Fast Optical Proximity Correction: Analytical Method," Optical/Laser Microlithography VIII, Proc. SPIE (2440) 1995, pages 261–269 describes a method for calculating proximity corrected features analytically.

SUMMARY OF THE INVENTION

Optical Proximity Correction often adds many small patterns around the original design. These small patterns can add significantly to the time needed to form the mask using an electron beam and in many cases do not add significantly to improvement of the pattern.

It is a primary objective of this invention to provide a method of performing Optical Proximity Correction on pattern segments which will not add excessively to the time required to form masks having the optical proximity corrected pattern using an electron beam.

It is another primary objective of this invention to provide a method of forming masks using Optical Proximity Correction on pattern segments which will not add excessively to the time required to form the mask using an electron beam.

These objectives are achieved by using curve fitting to approximate pattern edges and line ends of segments of patterns distorted by optical proximity effects such as line shortening and corner rounding. A unit normal vector and an area vector is determined for these curves. The unit normal vector is a unit vector perpendicular to the curves used to represent the pattern edges and directed toward the undistorted pattern edge. The area vector has the same direction as the unit normal vector and a magnitude determined by the distance between the curve used to represent the distorted pattern edge and the undistorted pattern edge.

An Optical Proximity Correction vector is then determined which is the sum of a first scaler function multiplied by the unit normal vector and a second scaler function multiplied by the area vector, wherein said first scaler function and said second scaler function are functions of position on the curve used to represent the distorted pattern edge. The curves used to represent the distorted pattern edge are then moved a distance and direction equal to the Optical Proximity Correction vector to define an optimum Optical Proximity Correction curve thereby defining a new pattern periphery.

The Optical Proximity Correction curve is very time consuming to duplicate in a mask using electron beam methods so regular geometric shapes; such as squares, rectangles, and triangles; are used to approximate the optimum Optical Proximity Correction curve thereby defining a new pattern periphery which achieves adequate Optical Proximity Correction. The new pattern periphery, defined using regular geometric shapes, can be formed in a mask using electron beam methods without requiring excessive time in the mask formation.

BRIEF DESCRIPTION OF THE DRAWINGS

FIG. 1A shows a top view of a line pattern.

FIG. 1B shows a top view of a line pattern transferred to an integrated circuit wafer showing the effects of line shortening due to Optical Proximity Effect.

FIG. 2A shows a top view of a rectangular pattern.

FIG. 2B shows a top view of a rectangular pattern transferred to an integrated circuit wafer showing the effects of corner rounding due to Optical Proximity Effect. segment transferred to an integrated circuit wafer showing the effects of corner rounding due to Optical Proximity Effect.

DESCRIPTION OF THE PREFERRED EMBODIMENTS

Refer now to FIGS. 3–12 for a description of the methods of this invention of applying Optical Proximity Correction to pattern segments. In the methods of this invention the Optical Proximity Correction is approximated by regular rectangular shapes; such as squares, rectangles, and triangles; to avoid excessive electron beam time consumption when masks are being fabricated.

Figure 3:
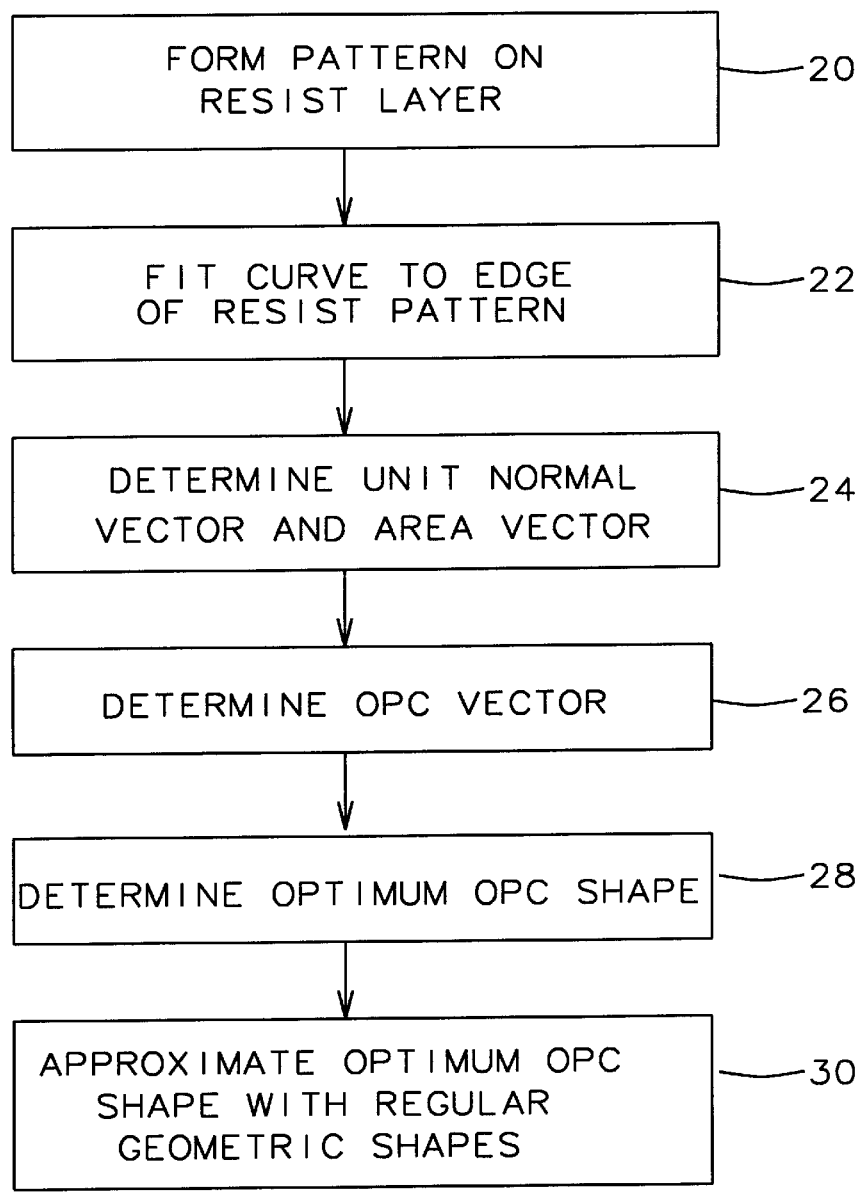
FIG. 3 shows a block diagram of the method of Optical Proximity Correction of this invention.
Figure 12:
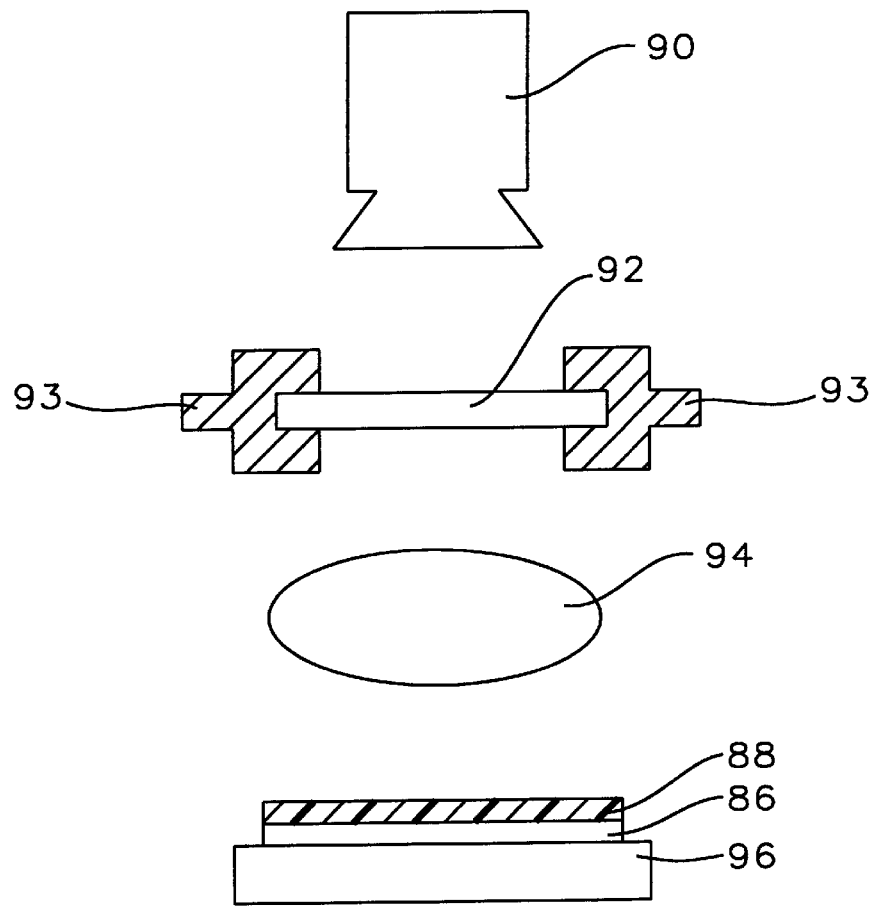
FIG. 12 shows a schematic view of a projection exposure system used to form patterns in a layer of resist.

FIG. 3 shows a block diagram of the key elements of the method of this invention. A line pattern 10, see FIG. 1A, or a larger rectangular pattern 16, see FIG. 2A, is to be transferred to a layer of resist formed on an integrated circuit wafer. First a test mask is formed having an uncorrected pattern. Next, as indicated in the first box 20 of FIG. 3, the test mask pattern is transferred to a layer of resist forming a first resist pattern. FIG. 12 shows a schematic diagram of a projection exposure system which is used to form the first resist pattern from the test mask. FIG. 12 shows a mask holder 93 which holds the mask 92 having the pattern to be transferred to a layer of resist. A wafer holder 96 holds a wafer 86 having a layer of resist 88 formed thereon. The mask holder 92 and wafer holder 96 position the mask 92 and wafer 86 relative to each other. The mask 92 is illuminated by light from a light source 90 and the mask pattern is focussed on the layer of resist 88. The resist is then exposed and developed.

Figure 4:
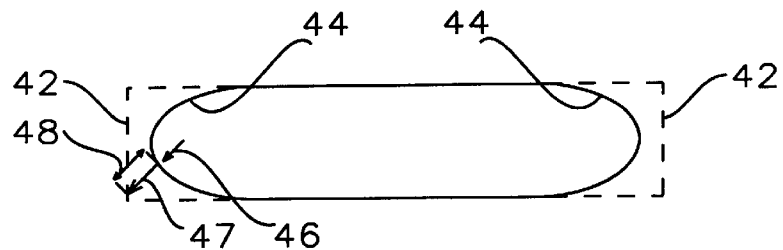
FIG. 4 shows curve fitting used to represent a distorted line pattern formed in a layer of resist in a test wafer.

FIGS. 3–7 show an embodiment of the method of this invention for the case of a line pattern segment. FIG. 4 shows the distorted first pattern edge 44 at the line ends of the first resist pattern for the example of a line pattern showing line shortening. As indicated in the next box 22 of the process flow shown in FIG. 3, curves are fitted to the pattern edge 44 of the first resist pattern in the critical region where the pattern is distorted. These curves could be regular mathematical curves, such as a parabola, or can be formed by numerical curve fitting the pattern edge 44 of the first resist pattern. Next, as indicated by the next box 24 of FIG. 3, a unit normal vector, reference number 46 in FIG. 4, and an area vector, reference number 47 in FIG. 4, are determined for selected points of the curve representing the pattern edge 44 in the critical region. As shown in FIG. 4, the unit normal vector 46, N, is a unit vector and is perpendicular to the curve representing the pattern edge 44 at a selected point on the curve. The area vector 47, D, has the same direction as the unit normal vector 46 and a magnitude representing the distance 48 of a line from the selected point on the curve to the undistorted pattern edge 42 in the direction of the unit normal vector 46.

Figure 5:
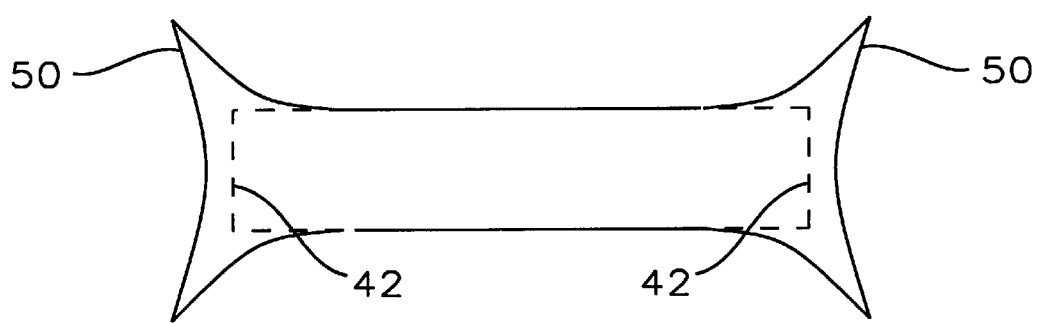
FIG. 5 shows the optimum OPC curve for the distorted line pattern of FIG. 4.

Next, as indicated by the next box 26 of FIG. 3, an optical proximity correction vector, P, is determined by forming the sum of a first scaler function, f(a), multiplied by the unit normal vector, N, at the selected coordinates of the curve and a second scaler function, g(a), multiplied by the area vector, D, at the selected coordinates of the mathematical curves, wherein the first scaler function, f(a), and said second scaler function, g(a), are functions of position on the curve representing the edge of the first resist pattern. Next, as indicated by the next box 28 of FIG. 3, the optical proximity correction vector, P, is used to determine the optimum optical proximity correction shape. As shown in FIG. 5, the optimum optical proximity correction shape 50 is determined by moving the curve used to describe the first resist pattern edge a distance and direction equal to the optical proximity correction vector at the selected coordinates of the curve. The first scaler function, f(a), and second scaler function, g(a), are determined by experiment and experience to optimize the optimum optical proximity correction shape 50.

Figure 6:
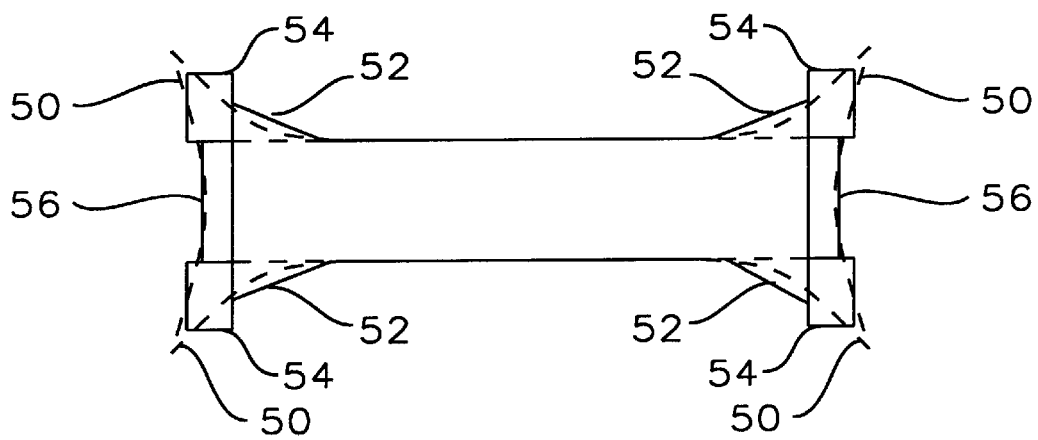
FIG. 6 shows the use of regular geometric shapes to approximate the OPC curve of FIG. 5.
Figure 7:
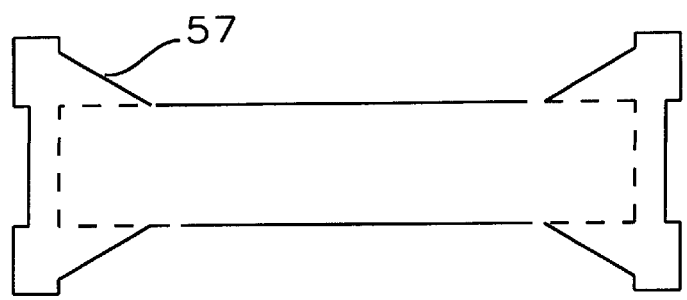
FIG. 7 shows the OPC corrected pattern used to form a line on a layer of resist.

Since forming a mask having the optimum optical proximity correction shape would require an excessive amount of electron beam processing time the optimum optical proximity correction shape is approximated by regular geometric shapes, rectangles or triangles, as indicated by box 30 of FIG. 3 and shown in FIG. 6. As shown in FIG. 6, in this example the optimum optical proximity correction shape 50 is approximated using rectangles, 54 and 56, and triangles 52. The final pattern corrected for optical proximity effect is shown by the solid line 57 in FIG. 7. The final pattern can then be transferred to a mask using standard electron beam mask fabrication techniques.

Figure 8:
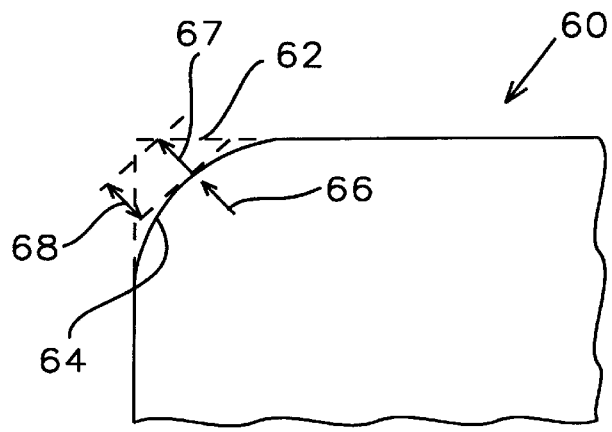
FIG. 8 shows curve fitting used to represent a distorted corner pattern formed in a layer of resist in a test wafer.

FIGS. 3 and 8–11 show an embodiment of the method of this invention for the case of corner rounding in a larger rectangular pattern segment. FIG. 8 shows the distorted first pattern edge 64 at a corner of the first resist pattern for the example of a rectangular pattern segment showing corner rounding. As indicated in the next box 22 of the process flow shown in FIG. 3, curves are fitted to the pattern edge 64 of the first resist pattern in the critical region where the pattern is distorted. These curves could be regular mathematical curves, such as a circle or hyperbola, or can be formed by numerical curve fitting the pattern edge 64 of the first resist pattern. Next, as indicated by the next box 24 of FIG. 3, a unit normal vector, reference number 66 in FIG. 8, and an area vector, reference number 67 in FIG. 8, are determined for selected points of the curve representing the pattern edge 44 in the critical region. As shown in FIG. 8, the unit normal vector 66, N, is a unit vector and is perpendicular to the curve representing the pattern edge 64 at a selected point on the curve. The area vector 67, D, has the same direction as the unit normal vector 66 and a magnitude representing the distance 68 of a line from the selected point on the curve to the undistorted pattern edge 62 in the direction of the unit normal vector 66.

Figure 9:
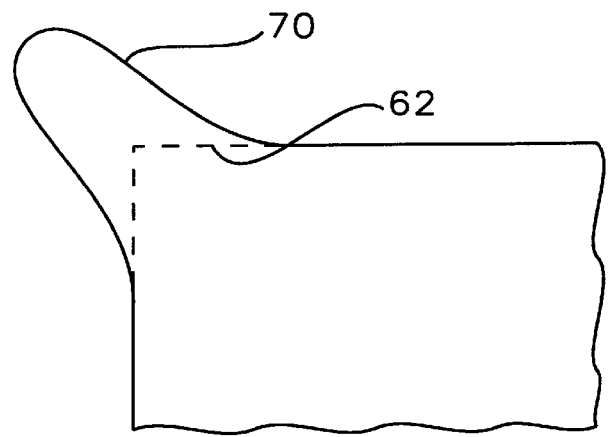
FIG. 9 shows the optimum OPC curve for the distorted corner pattern of FIG. 8.

Next, as indicated by the next box 26 of FIG. 3, an optical proximity correction vector, P, is determined by forming the sum of a first scaler function, f(a), multiplied by the unit normal vector, N, at the selected coordinates of the curve and a second scaler function, g(a), multiplied by the area vector, D, at the selected coordinates of the mathematical curves, wherein the first scaler function, f(a), and said second scaler function, g(a), are functions of position on the curve representing the edge of the first resist pattern. Next, as indicated by the next box 28 of FIG. 3, the optical proximity correction vector, P, is used to determine the optimum optical proximity correction shape. As shown in FIG. 9, the optimum optical proximity correction shape 70 is determined by moving the curve used to describe the first resist pattern edge a distance and direction equal to the optical proximity correction vector at the selected coordinates of the curve. The first scaler function, f(a), and second scaler function, g(a), are determined by experiment and experience to optimize the optimum optical proximity correction shape 70.

Figure 10:
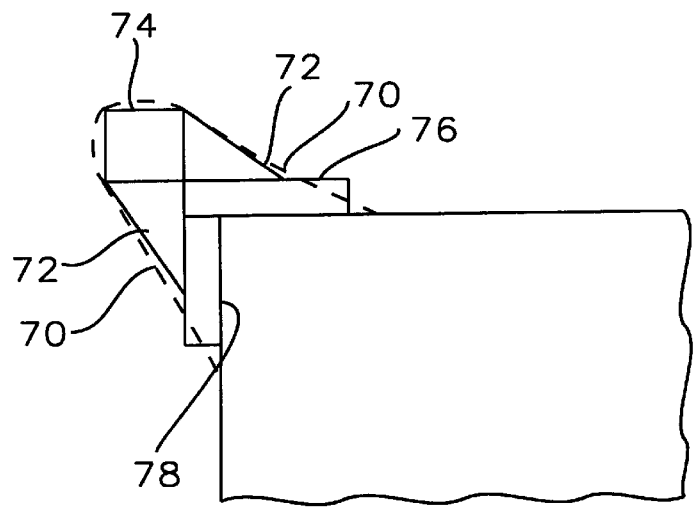
FIG. 10 shows the use of regular geometric shapes to approximate the OPC curve of FIG. 9.
Figure 11:
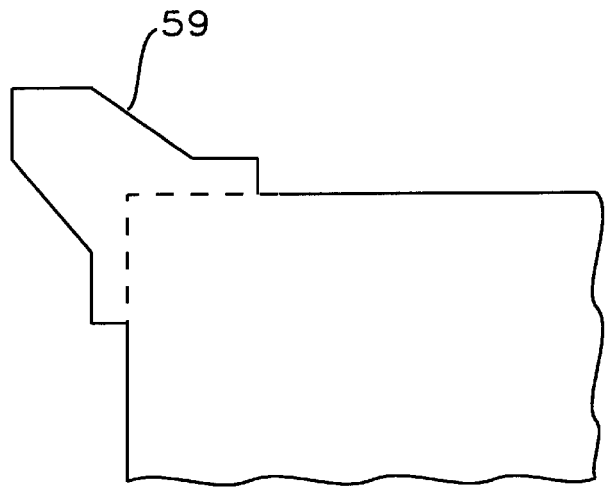
FIG. 11 shows the OPC corrected pattern used to form a corner in a layer of resist.

Since forming a mask having the optimum optical proximity correction shape would require an excessive amount of electron beam processing time the optimum optical proximity correction shape is approximated by regular geometric shapes, rectangles or triangles, as indicated by box 30 of FIG. 3 and shown in FIG. 10. As shown in FIG. 10, in this example the optimum optical proximity correction shape 70 is approximated using rectangles, 76 and 78, a square 74, and triangles 72. The final pattern corrected for optical proximity effect is shown by the solid line 59 in FIG. 11. The final pattern can then be transferred to a mask using standard electron beam mask fabrication techniques.

While the invention has been particularly shown and described with reference to the preferred embodiments thereof, it will be understood by those skilled in the art that various changes in form and details may be made without departing from the spirit and scope of the invention.

What is claimed is:

1. A method of performing optical proximity correction, comprising:

providing a first pattern having first pattern edges and first pattern critical regions;

forming a test mask having said first pattern formed thereon without optical proximity correction;

providing a test substrate having a layer of resist formed thereon;

forming a second pattern having second pattern edges and second pattern critical regions using said test mask and photolithographic processing methods, wherein the shape of said second pattern edges in said second pattern critical regions are different than the shape of said first pattern edges in said first pattern critical regions;

using mathematical curves to approximate the shape of said second pattern edges in said first pattern critical regions;

selecting a number of coordinates of said mathematical curves;

determining a unit normal vector at said selected coordinates of said mathematical curves wherein said unit normal vector is perpendicular to said mathematical curve and directed toward said first pattern edges;

determining an area vector at said selected coordinates of said mathematical curves wherein said area vector has the same direction of said unit normal vector at said selected coordinates of said mathematical curves and a magnitude equal to the distance between said mathematical curves and said first pattern edges;

determine an optical proximity correction vector at said selected coordinates of said mathematical curves wherein said optical proximity correction vector is the sum of a first scaler function multiplied by said unit normal vector at said selected coordinates of mathematical curves and a second scaler function multiplied by said area vector at said selected coordinates of said mathematical curves, wherein said first scaler function and said second scaler function are functions of position on said mathematical curves;

determining an optimum optical proximity correction shape by moving said mathematical curve a distance and direction equal to said optical proximity correction vector at said selected coordinates of said mathematical curve;

using regular geometric shapes to approximate the region between said optical proximity shape and said first pattern edges; and determining an optical proximity corrected first pattern by adding said regular geometric shapes to said first pattern edges.

2. The method of claim 1 wherein said regular geometric shapes comprise one or more squares.

3. The method of claim 1 wherein said regular geometric shapes comprise one or more rectangles.

4. The method of claim 1 wherein said regular geometric shapes comprise one or more triangles.

5. The method of claim 1 wherein said mathematical curves comprise one or more hyperbolas.

6. The method of claim 1 wherein said mathematical curves comprise one or more parabolas.

7. The method of claim 1 wherein said mathematical curves are determined by numerical curve fitting at said selected coordinates of said second pattern edge.

8. The method of claim 1 wherein said optical proximity corrected first pattern is used to form an optical proximity corrected mask.

9. The method of claim 8 wherein said optical proximity corrected mask is formed using electron beam methods.

10. A method of forming an optical proximity corrected mask, comprising:

providing a first pattern having first pattern edges and first pattern critical regions;

forming a test mask having said first pattern formed thereon without optical proximity correction;

providing a test substrate having a layer of resist formed thereon;

forming a second pattern having second pattern edges and second pattern critical regions using said test mask and photolithographic processing methods, wherein the shape of said second pattern edges in said second pattern critical regions are different than the shape of said first pattern edges in said first pattern critical regions;

using mathematical curves to approximate the shape of said second pattern edges in said first pattern critical regions;

selecting a number of coordinates of said mathematical curves;

determining a unit normal vector at said selected coordinates of said mathematical curves wherein said unit normal vector is perpendicular to said mathematical curve and directed toward said first pattern edges;

determining an area vector at said selected coordinates of said mathematical curves wherein said area vector has the same direction of said unit normal vector at said selected coordinates of said mathematical curves and a magnitude equal to the distance between said mathematical curves and said first pattern edges;

determine an optical proximity correction vector at said selected coordinates of said mathematical curves wherein said optical proximity correction vector is the sum of a first scaler function multiplied by said unit normal vector at said selected coordinates of mathematical curves and a second scaler function multiplied by said area vector at said selected coordinates of said mathematical curves, wherein said first scaler function and said second scaler function are functions of position on said mathematical curves;

determining an optimum optical proximity correction shape by moving said mathematical curve a distance and direction equal to said optical proximity correction vector at said selected coordinates of said mathematical curve;

using regular geometric shapes to approximate the region between said optical proximity shape and said first pattern edges;

determining an optical proximity corrected first pattern by adding said regular geometric shapes to said first pattern edges; and forming said optical proximity corrected first pattern on a mask substrate, thereby forming an optical proximity corrected mask.

11. The method of claim 10 wherein said regular geometric shapes comprise one or more squares.

12. The method of claim 10 wherein said regular geometric shapes comprise one or more rectangles.

13. The method of claim 10 wherein said regular geometric shapes comprise one or more triangles.

14. The method of claim 10 wherein said mathematical curves comprise one or more hyperbolas.

15. The method of claim 10 wherein said mathematical curves comprise one or more parabolas.

16. The method of claim 10 wherein said mathematical curves are determined by numerical curve fitting at said selected coordinates of said second pattern edge.

17. The method of claim 10 wherein said optical proximity corrected mask is formed using electron beam methods.

* * * * *